United States Patent
Kawaguchi et al.

(10) Patent No.: US 6,673,436 B2
(45) Date of Patent: Jan. 6, 2004

(54) MOISTURE ABSORBING FORMED ARTICLE

(75) Inventors: Yohei Kawaguchi, Osaka (JP);
Masayuki Fujimori, Shiga (JP); Teruo Uchibori, Shiga (JP); Kaneto Ohyama, Shiga (JP); Atsushi Nishino, Neyagawa (JP)

(73) Assignee: Dynic Corporation, Kyoto (JP)

( * ) Notice: Subject to any disclaimer, the term of this patent is extended or adjusted under 35 U.S.C. 154(b) by 0 days.

(21) Appl. No.: 10/031,622

(22) PCT Filed: May 17, 2001

(86) PCT No.: PCT/JP01/04121
§ 371 (c)(1),
(2), (4) Date: Apr. 19, 2002

(87) PCT Pub. No.: WO01/88041
PCT Pub. Date: Nov. 22, 2001

(65) Prior Publication Data
US 2002/0183431 A1 Dec. 5, 2002

(30) Foreign Application Priority Data

May 17, 2000 (JP) .......................................... 2000-145633
Oct. 20, 2000 (JP) .......................................... 2000-321241

(51) Int. Cl.$^7$ .......................... H05B 33/04; B32B 5/16; C08K 3/22
(52) U.S. Cl. .................... 428/330; 428/331; 428/421; 428/422; 428/523; 524/423; 524/433
(58) Field of Search .................... 428/330, 331, 428/421, 422, 523; 524/423, 433

(56) References Cited

U.S. PATENT DOCUMENTS 5,882,761 A 3/1999 Kawami et al. .............. 428/69
6,226,890 B1 5/2001 Boroson et al. .............. 34/472

FOREIGN PATENT DOCUMENTS

| JP | 2-197071 A | 8/1990 |
| JP | 3-29291 A | 2/1991 |
| JP | 4-181688 A | 6/1992 |
| JP | 4-192291 A | 7/1992 |
| JP | 4-210233 A | 7/1992 |
| JP | 6-119970 A | 4/1994 |
| JP | 8-217913 A | 8/1996 |
| JP | 10-292123 A | 11/1998 |
| JP | 11-54266 A | 2/1999 |
| JP | 2000-30857 A | 1/2000 |
| JP | 2000-30871 A | 1/2000 |
| JP | 2000-68048 A | 3/2000 |
| JP | 2000-164349 A | 6/2000 |
| JP | 2000-195659 A | 7/2000 |
| JP | 2000-195661 A | 7/2000 |
| JP | 2000-195662 A | 7/2000 |
| JP | 2000-195663 A | 7/2000 |
| JP | 2000-260562 A | 9/2000 |
| JP | 2000-281908 | 10/2000 |
| JP | 2000-281909 A | 10/2000 |
| JP | 2000-310958 A | 11/2000 |
| JP | 2001-57291 A | 2/2001 |
| JP | 2001-68266 A | 3/2001 |
| JP | 2001-126862 A | 5/2001 |
| JP | 2001-185347 A | 7/2001 |
| JP | 2002-18227 | 1/2002 |
| JP | 2002-280166 | 9/2002 |

*Primary Examiner*—D. S. Nakarani
(74) *Attorney, Agent, or Firm*—Knobbe, Martens, Olson & Bear LLP

(57) ABSTRACT

An object of the present invention is to provide a material which can absorb moisture with ease and certainly, which exists in an equipment such as an electronic device. The invention relates to a moisture absorbing formed body comprising a hygroscopic agent and a resinous component.

12 Claims, 7 Drawing Sheets

MOISTURE ABSORBING FORMED ARTICLE

TECHNICAL FIELD

The present invention relates to a moisture absorbing formed body.

BACKGROUND ART

Electronic devices such as batteries, capacitors (condensers), display units and so forth are steadily heading for further down sizing and weight reduction. These electronic parts are sealed, without exception, with a rubber sealant or a resin adhesive such as UV-curable resin in the stage of sealing the outer housing. However, when such a sealing technique is used, the moisture penetrating through the sealant during storage or use detracts from the performance of the electronic parts. Thus, the moisture finding its way into an electronic device may cause a degradation or corrosion of electronic parts within the device. For example, in a battery or capacitor using an organic electrolyte, contamination of the electrolyte with water causes not only changes in electrical conductivity, electrolysis of the invading water, etc. but also a voltage depression across the terminals and distortion and leakage of the housing due to evolution of gases. Thus, owing to the moisture infiltrating into electronic devices, the functional stability and reliability of the devices can hardly be maintained.

To overcome this disadvantage, the so-called hermetic sealing or metal welding might be considered. However, with such techniques, swelling of the package housing or distortion of the housing due to internal pressure reduction would occur to induce chemical changes in the internal functional component materials.

On the other hand, in the stage of assembling such as electronic device, it is practically impossible to control humidity at 0 throughout the stage. Therefore, for example, in the aging stage after completion of an electronic device, it is indispensable to absorb the moisture which has infiltrated into the electronic device during its assembling. However, as mentioned above, there has not been established a technology by which the moisture infiltrating into an electronic device can be absorbed infallibly and easily.

DISCLOSURE OF INVENTION

A primary object of the present invention, therefore, is to overcome the above-mentioned drawbacks of the prior art and provide an formed body capable of absorbing the moisture infiltrating into the interior of a device, such as an electronic device, with ease and without fail.

In view of the above disadvantage of the prior art, the inventor of the present invention did intensive investigations and found that a herein-defined moisture absorbing shaped article is capable of accomplishing the above object. The inventor has accordingly perfected this present invention.

The present invention, therefore, relates to the following moisture absorbing formed bodies.

1. A moisture absorbing formed body comprising a hygroscopic agent and a resinous component.
2. A moisture absorbing formed body according to Paragraph 1 wherein the hygroscopic agent comprises at least one member selected from the group consisting of the oxides and sulfates of alkaline earth metals.
3. A moisture absorbing formed body according to Paragraph 1 wherein the hygroscopic agent is at least one member selected from the group consisting of CaO, BaO and SrO.
4. A moisture absorbing formed body according to Paragraph 1 wherein the hygroscopic agent is a powder having a specific surface area of not less than 10 $m^2/g$.
5. A moisture absorbing formed body according to Paragraph 1 wherein the hygroscopic agent is a powder having a specific surface area of not less than 40 $m^2/g$.
6. A moisture absorbing formed body according to Paragraph 1 wherein the hygroscopic agent accounts for 30–95 weight % of the moisture absorbing formed body.
7. A moisture absorbing formed body according to Paragraph 1 wherein the resinous component is at least one member selected from the group consisting of fluorine-containing resin, polyolefin resin, polyacrylic resin, polyacrylonitrile resin, polyamide resin, polyester resin and epoxy resin.
8. A moisture absorbing formed body according to Paragraph 1 further comprising a gas absorbent.
9. A moisture absorbing formed body according to Paragraph 8 wherein the gas absorbent comprises an inorganic porous substance.
10. A moisture absorbing formed body according to Paragraph 1, the surface of which is covered wholly or in part with a resinous covering layer.
11. A moisture absorbing formed body according to Paragraph 1, wherein the resinous component has been fibrillated.
12. A moisture absorbing formed body according to Paragraph 1, wherein the hygroscopic agent is a powder composed of at least one member selected from the group consisting of CaO, BaO and SrO which has a specific surface area of not less than 10 $m^2/g$ and the resinous component is a fluorine-containing resin (fluororesin).
13. A moisture absorbing formed body according to Paragraph 12 wherein the fluorine-containing resin has been fibrillated.
14. A moisture absorbing formed body according to Paragraph 1 for electronic device use.

The moisture absorbing formed body of the present invention comprises a hygroscopic agent and a resinous component. The morphology or geometry of the moisture absorbing formed body is not restricted but can be judiciously selected according to the mode of use, purpose of use, and site of use of the end product, among other variables, thus including sheets, pellets, plates, films, grains (granules), and so forth.

The hygroscopic agent need only be a substance having at least the function of absorbing moisture but is preferably a compound which adsorbs moisture and retains its solid state even upon adsorption of moisture. Among examples of such compound are various metal oxides and salts of metals with inorganic or organic acids but it is particularly preferable to use at least one member selected from the group consisting of the oxides of alkaline earth metals and sulfates.

The oxides of alkaline earth metals include, for example, calcium oxide (CaO), barium oxide (BaO), magnesium oxide (MgO), and strontium oxide (SrO), or the like.

As the sulfates, there can be mentioned lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), and nickel sulfate ($NiSO_4$), among others. Aside from the above oxides and sulfates, organic compounds having hygroscopic properties can also be used as the hygroscopic agent in accordance with the present invention.

As the hygroscopic agent for use in the present invention, an alkaline earth metal oxide is preferred. Particularly preferred is at least one member selected from the group consisting of CaO, BaO and SrO. The most preferred is CaO.

The hygroscopic agent for use in the present invention is formulated preferably in a powdery form. In this case, the specific surface area (BET specific surface area) of the powder should be generally not less than 10 m$^2$/g, preferably not less than 30 m$^2$/g, particularly not less than 40 m$^2$/g. As the hygroscopic agent in powdery form, the CaO (powder) obtainable by heating calcium hydroxide at a temperature not over 900° C. (preferably not over 700° C., most preferably not over 500° C. (particularly 490–500° C.)), can be used with advantage. In the practice of the present invention, a CaO powder having a BET specific surface area of not less than 10 m$^2$/g, preferably not less than 30 m$^2$/g, particularly not less than 40 m$^2$/g, can be used most advantageously.

On the other hand, the resinous component is not particularly restricted provided that the water-removing action of the hygroscopic agent is not interfered with, and a gas-permeable polymer (that is to say a polymer or resin having low gas barrier properties) can be used with advantage. For example, there can be mentioned fluorine-containing resin, polyolefin resin, polyacrylic resin, polyacrylonitrile resin, polyamide resin, polyester resin, epoxy resin, and polycarbonate resin. The degree of gas permeability may be judiciously selected according to the use and desired characteristics of the end product.

Among these polymers, fluorine-containing resin and polyolefin resin are preferred. As specific examples of the fluorine-containing resin, polytetrafluoroethylene, polychlorotrifluoroethylene, polyvinylidene fluoride, ethylene-tetrafluoroethylene copolymer, etc. can be mentioned. The polyolefin resin includes polyethylene, polypropylene, polybutadiene, polyisoprene, etc. and the corresponding copolymers. Among these resinous components, the fluororesin is particularly preferred for purposes of the present invention.

In the present invention, the formulating levels of said hygroscopic agent and resinous component may be judiciously selected according to the species of respective materials, among other variables, but the usual proportions based on 100 weight % of the hygroscopic agent and resinous component taken together are about 30–95 weight % of the hygroscopic agent and about 70–5 weight % of the resinous component. The preferred formulating levels are about 50–85 weight % of the hygroscopic agent and about 50–15 weight % of the resinous component, and the most preferred levels are about 55–85 weight % of the hygroscopic agent and about 45–15 weight % of the resinous component.

In the practice of the present invention, within the range not adversely affecting the effect of the invention, other components may also be incorporated where necessary. For example, a gas-absorbing material (gas adsorbent) may be added. The gas adsorbent includes, for example, inorganic porous substances such as silica, alumina, and synthetic zeolite or the like. The formulating level of the gas adsorbent is not restricted but may generally be about 3–15 parts by weight based on 100 parts by weight of the hygroscopic agent and resinous component taken together.

Furthermore, where necessary, the moisture absorbing formed body of the present invention may be provided with a resinous covering layer containing a resin material, either all over its surface or in part of its surface. By means of this layer, the moisture absorbing performance of the formed body can be better controlled. The resin material of said resinous covering layer need only be a resin having high gas permeability and, as such, may for example be any of the materials mentioned for the resin component of the moisture absorbing formed body. The preferred is said polyolefin resin.

In the above resinous component, a powder composed of inorganic material or metal may optionally be dispersed, if necessary. By doing so, the durability of the formed body withstanding a sharp change in temperature or humidity can be further enhanced. Particularly, a powder (flaky particles) showing the leafing phenomenon, such as mica, aluminum powder or the like, is preferred. The formulating amount of said powder is not particularly restricted but may usually be about 30–50 weight % of the resinous covering layer.

The thickness of the resin covering layer can be judiciously selected according to the desired moisture-absorbing capacity and the species of resin constituting the resinous covering layer, among other variables, but may be generally about 0.5–20 μm, preferably 0.5–10 μm. Therefore, the particle diameter of said powder should generally be smaller than the thickness of the resinous covering layer.

The moisture absorbing formed body of the present invention can be obtained by blending the respective component materials evenly and forming the blend into a desired shape. In this operation, the hygroscopic agent and said gas adsorbent are preferably dehydrated well before formulation. Moreover, in the blending of the resinous component, the material may be heated into a molten state, where necessary. The forming or shaping process is carried out using the known techniques. Thus, not only press forming (inclusive of hot pressing), extrusion etc. but also the granulation technique using a rotary granulator, twin-screw granulator, or the like may be employed.

When the objective moisture absorbing formed body is a sheet, a sheet as formed may be subjected to orientation treatment and used as said moisture absorbing sheet. The orientation can be effected by the known technology and may for example be uniaxial or biaxial orientation.

When the resinous covering layer is provided, the method of forming the layer is not restricted but may for example be the known lamination method. For example, when the moisture absorbing formed body is a sheet, a sheet or film for resin covering layer use, prepared in advance, can be laminated onto at least one of the face side and reverse side of the moisture absorbing sheet.

For example, a resinous covering layer (2) may be formed on the reverse side of a moisture absorbing sheet (1) as shown in FIG. 1. As shown in FIG. 2, a resin covering layers (2)(2) may be formed on each of the face and reverse sides of a moisture absorbing sheet (1).

The thickness of the sheet, when the moisture absorbing formed body is in sheet form, can be judiciously selected according to the object of use of the end product, among other factors. For example, when the moisture absorbing formed body is to be applied to an electronic device such as a capacitor, the thickness may for example be generally about 50–400 μm, preferably about 100–200 μm. The sheet thickness mentioned above is the thickness inclusive of the resinous covering layer if present.

In the moisture absorbing formed body of the present invention, it is preferable that the resinous component should have been fibrillated. By this fibrillation, a further improved moisture absorbing performance can be obtained.

The fibrillation may be performed simultaneously with the molding of the moisture absorbing formed body or by post-forming processing. For example, the fibrillation of the resin can be effected by dry-blending the resinous component and hygroscopic agent and rolling the resultant blend. As an alternative, the fibrillation may be effected by subjecting the formed body of the invention as formed to said orientation treatment. To be more specific, a fibrillated moisture absorbing formed body can be manufactured by dry-blending a powdery hygroscopic agent comprising at least one member selected from the group consisting of CaO, BaO and SrO with a powdery fluororesin (e.g. polytetrafluoroethylene) and rolling the resulting blend. The rolling and orientation may respectively be carried out using the known equipment. The degree of fibrillation can be properly controlled according to the use and desired characteristics of the end product. The powdery hygroscopic agent is preferably a powder having the above-defined specific surface area. The fluororesin is not restricted but includes the known or commercial powdery (granular) fluororesins as such.

The moisture absorbing formed body of the present invention may be simply located in a position requiring absorption of moisture by the per se known method. For example, for the purpose of dehumidifying the atmosphere within the housing of an electronic device, the moisture absorbing formed body may be immobilized on part or the whole of the inside surface of the housing. Referring to a capacitor or battery utilizing an organic electrolyte, the moisture absorbing formed body may be caused to exist within the organic electrolyte for adsorbing water from the organic electrolyte.

The method for said immobilization is not particularly restricted insofar as the formed body can be securely fixed in position. For example, there can be mentioned the method which comprises securing the moisture absorbing formed body to the housing by means of the known self-adhesive tape or adhesive (preferably a solventless adhesive), the method which comprises securing the moisture absorbing formed body to the housing by thermal fusion, and the method which comprises fixing the moisture absorbing formed body to the housing securely with fastener means such as small screws, among others.

Taking a moisture absorbing formed body in the form of a sheet having a resinous covering layer on each of the face and reverse sides as an example, when an adhesive layer (3) with release paper (4) is formed on the sheet as shown in FIG. 3, the sheet can be affixed in position, on the strength of its adhesive layer, after peeling off the release paper. Moreover, as shown in FIG. 4, the moisture absorbing sheet can be secured to the housing with the aid of a solventless adhesive (5) based on ethylene-vinyl alcohol copolymer (EVOH) or the like. As the solventless adhesive, a commercial product can be utilized.

In accordance with the present invention wherein a moisture absorbing formed body is used, the moisture infiltrating into an electronic device or the like can be removed easily and with certainty.

As a consequence, the placement of desiccating means can be mechanized as well. Thus, chances for moisture finding its way into the internal atmosphere are reduced and even establishment of an atmosphere having a high initial level of dryness is feasible. Thus, it is not only possible to manufacture devices in highly dry state but also possible to remove moisture with certainty after manufacture, so that devices of higher stability and reliability can be provided on a commercial scale.

Unlike the case in which, as drying means, the conventional desiccant (powder) is used directly, the trouble of the powder getting loose and scattered within the housing can also be avoided. Furthermore, whereas the use of a powder as such makes it imperative to provide a space for its placement, this is not required in the the present invention so that the invention contributes to the down sizing and weight reduction of devices as well.

The moisture absorbing formed body having these features is expected to find application in a variety of uses including electronic components, machine parts, automobiles, communications equipment, architectural members, medical materials and precision machinery.

BEST MODE FOR CARRYING OUT THE INVENTION

The following examples are intended to point out the features and advantages of the the present invention in further detail. It should, however, be understood that the invention is by no means restricted to these examples.

EXAMPLE 1

A moisture absorbing formed body in sheet form was prepared.

The hygroscopic agent CaO powder (purity 99.9%) was sufficiently dehydrated by heating at 900° C. for 1 hour, then cooled in a falling rate drying atmosphere of 180–200° C., and cooled ultimately to room temperature. After 60 weight % of the resulting CaO powder (BET specific surface area ca 3 m$^2$/g) and 40 weight % of the resinous component polyethylene (molecular weight: ca $10 \times 10^4$) were dry-blended, the blend was melt-kneaded under heating at about 230° C. This kneaded mass was extruded in sheet form from a T-die to give a moisture absorbing formed body in the form of a 300 μm-thick sheet.

EXAMPLE 2

On each of the face and reverse sides of a moisture absorbing sheet of the same formulation as used in Example 1, a resin covering layer of low-density polyethylene was laminated by concurrent extrusion (in a thickness of ca 3 μm for each side) to provide a sheet having a total thickness of 300 μm.

EXAMPLE 3

On each of the face and reverse sides of a moisture absorbing sheet of the same formulation as used in Example 1, a resin covering layer of low-density polyethylene was laminated by concurrent extrusion (in a thickness of ca 12 μm for each side) to provide a sheet having a total thickness of 300 μm.

TEST EXAMPLE 1

With the sheets obtained in Examples 1–3, the change in weight due to absorption of moisture was monitored in a time series. Thus, each sample strip (25 mm×14 mm×300 μm thickness) was set in an atmosphere controlled at a temperature of 50° C. and a relative humidity of 80% RH and the rate of weight gain (%) was determined at timed intervals. The rate of weight gain (%) was calculated by means of the following equation.

Rate of weight gain (%)=(weight gain of sample strip/weight of moisture absorbing formed body before test)×100

Figure 1:
FIG. 1 is a view showing an example of the moisture absorbing formed body according to the invention.
Figure 2:
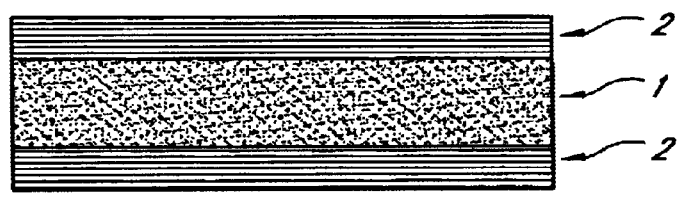
FIG. 2 is a view showing another example of the moisture absorbing formed body according to the invention.
Figure 3:
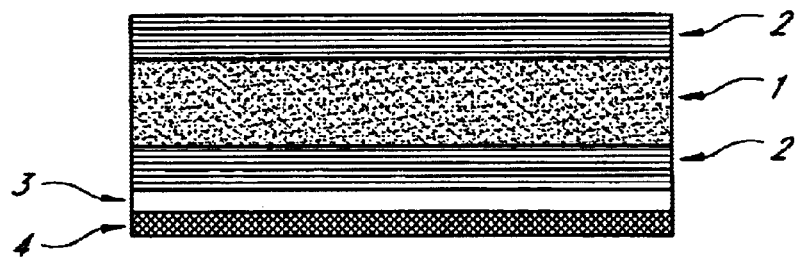
FIG. 3 is a view showing a still another example of the moisture absorbing formed body according to the invention.
Figure 4:
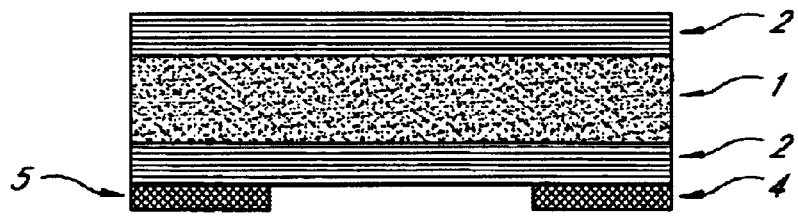
FIG. 4 is a view showing another yet example of the moisture absorbing formed body according to the invention.
Figure 5:
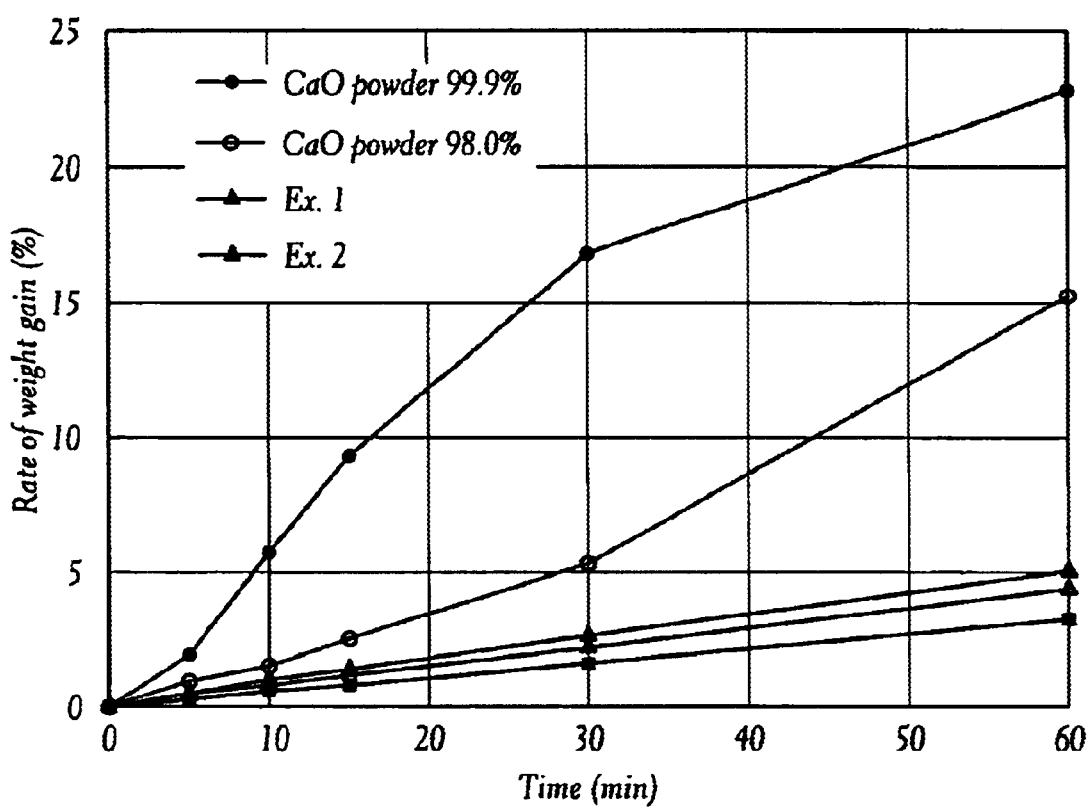
FIG. 5 is a diagrammatic representation of the time course of weight as determined in Test Example 1.

The results are shown in Table 1 and FIG. 5.

TABLE 1

|  | Time (min) | | | | | |
| --- | --- | --- | --- | --- | --- | --- |
|  | 0 | 5 | 10 | 15 | 30 | 60 |
| Example 1 (%) | 0.00 | 0.60 | 1.00 | 1.40 | 2.62 | 5.02 |
| Example 2 (%) | 0.00 | 0.50 | 0.80 | 1.20 | 2.18 | 4.37 |
| Example 3 (%) | 0.00 | 0.30 | 0.60 | 0.80 | 1.63 | 3.19 |

In FIG. 5, for comparison's sake, the weight changes determined with two kinds of moisture absorbing powders each used alone are also shown. In FIG. 5, the closed circle (●) represents a calcium oxide powder (purity 99.9%) alone, the open circle (○) represents a calcium oxide powder (purity 98.0%) alone, the closed triangle (▲) represents Example 1, the open triangle (Δ) represents Example 2, and the black square (■) represents Example 3.

The data of FIG. 5 clearly indicate that appropriate moisture-absorbing effects can be obtained with the moisture absorbing formed bodies of the present invention. It is, therefore, clear that by placing the moisture absorbing formed body of the invention in an electronic device or the like, not only the initial moisture within the device but also the moisture infiltrating into the device through a sealant can be certainly removed.

EXAMPLE 4

As the hygroscopic agent, SrO powder (particle size 10 μm pass), 60 weight %, and, as the resinous component, a fluororesin (polytetrafluoroethylene (PTFE)), 40 weight %, were respectively used. These were thoroughly blended in powdery state. Using a calender roll, the resulting blend was rolled into a 300 μm-thick sheet. In this sheet, the PTFE resin had been fibrillated to give an SrO-containing porous structure.

EXAMPLE 5

Except that, as the hygroscopic agent, SrO powder (particle size 10 μm pass), 60 weight %, and, as the resinous component, polyethylene, 40 weight %, were respectively used, the procedure of Example 1 was otherwise repeated to manufacture a moisture absorbing formed body in the form of a 300 μm-thick sheet.

EXAMPLE 6

Except that, as the hygroscopic agent, the same CaO powder as used in Example 1 was used, the procedure of Example 4 was otherwise repeated to manufacture a fibrillated resin sheet having a thickness of 300 μm.

TEST EXAMPLE 2

Figure 6:
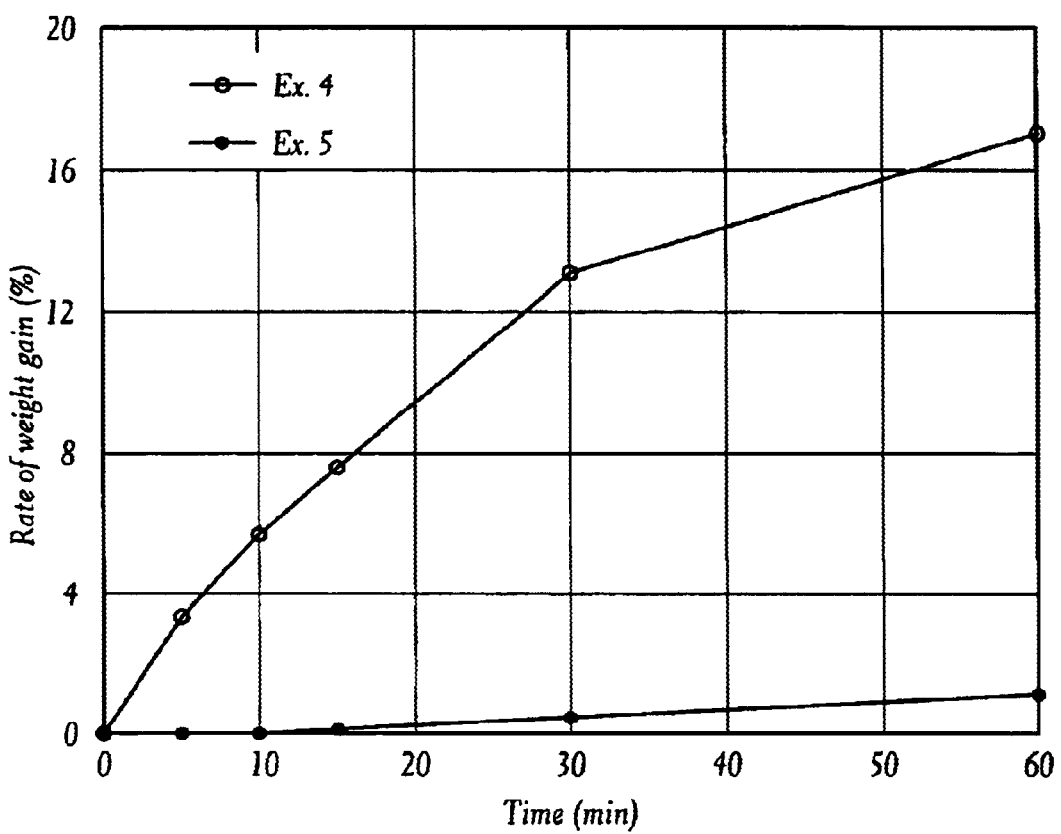
FIG. 6 is a diagrammatic representation of the time course of weight as determined in Test Example 2.

With the sheets obtained in Examples 4 and 5, the change in weight due to moisture absorption was investigated in a time series. Each sample strip (25 mm×14 mm×300 μm thickness) was set in an atmosphere controlled at a temperature of 20° C. and a relative humidity of 65% RH and the rate of weight gain (%) was determined at timed intervals. The rate of weight gain was calculated by the same procedure as used in Test Example 1. The results are shown in Table 2 and FIG. 6.

TABLE 2

|  | Time (min) | | | | | |
| --- | --- | --- | --- | --- | --- | --- |
|  | 0 | 5 | 10 | 15 | 30 | 60 |
| Example 4 (%) | 0.0 | 3.3 | 5.7 | 7.6 | 13.1 | 17.1 |
| Example 5 (%) | 0.00 | 0.03 | 0.06 | 0.09 | 0.45 | 1.16 |

EXAMPLE 7

As the hygroscopic agent, a CaO powder having a BET specific surface area of 48 m$^2$/g (particle size 10 μm pass), 60 weight %, and, as the resinous component, polyethylene (molecular weight: ca 10×10$^4$), 40 weight %, were respectively used. These were dry-blended and the blend was melt-kneaded under heating at about 230° C. The kneaded mass was extruded in sheet form from a T-die to manufacture a moisture absorbing formed body in the form of a 300 μm-thick sheet. As said CaO powder, calcium hydroxide baked in a nitrogen gas at 500° C. and adjusted to the above-mentioned specific surface area was used.

EXAMPLE 8

As the hygroscopic agent, the same CaO powder as used in Example 7, 60 weight %, and, as the resinous component, a fluororesin (polytetrafluoroethylene (PTFE)) powder, 40 weight %, were respectively used. These were thoroughly blended in powdery state. Using a calender roll, the resulting blend was rolled into a 300 μm-thick sheet. In this sheet, the PTFE resin had been fibrillated to give a CaO-containing porous structure.

Test Example 3

Figure 7:
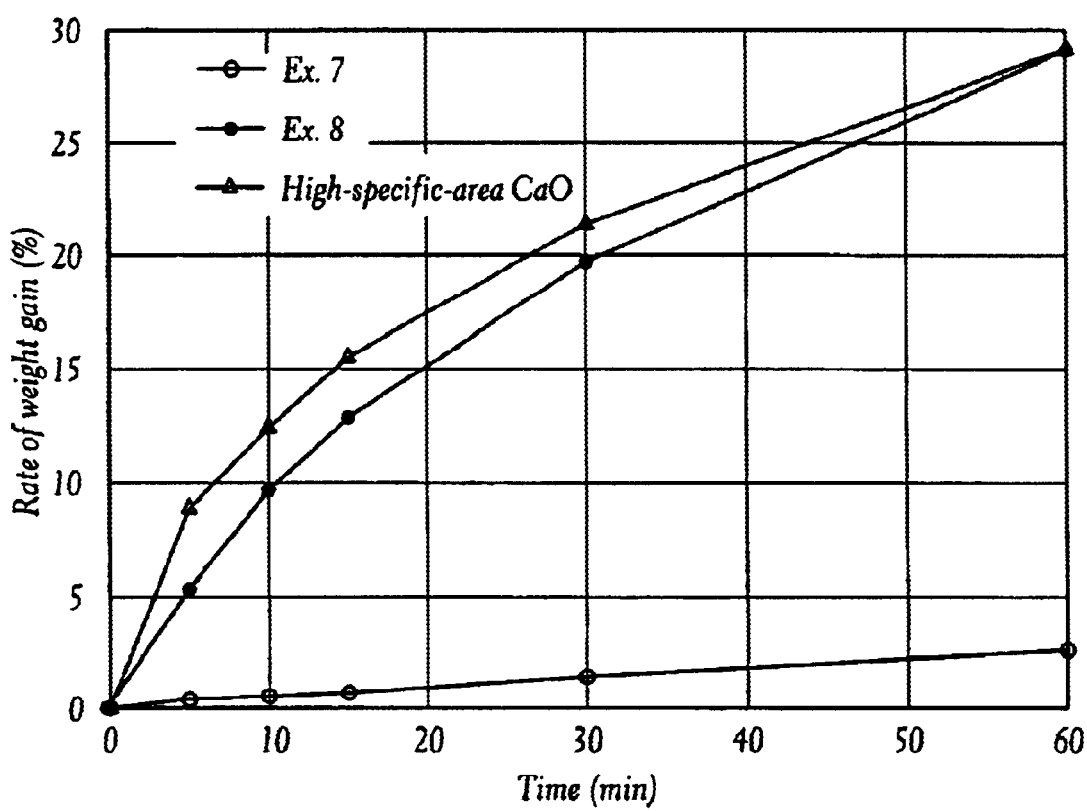
FIG. 7 is a diagrammatic representation of the time course of weight as determined in Test Example 3.

With the sheets obtained in Examples 7 and 8, the change in weight due to moisture absorption was monitored in a time series. Each sample strip (25 mm×14 mm×300 μm thickness) was set in an atmosphere controlled at a temperature of 20° C. and a relative humidity of 65% RH and the rate of weight gain (%) was determined at timed intervals. The rate of weight gain was calculated by the same procedure as used in Test Example 1. The results are shown in Table 3 and FIG. 7. The test results obtained with the hygroscopic agent (high-specific-area CaO) alone are also shown.

TABLE 3

| | Time (min) | | | | | |
|---|---|---|---|---|---|---|
| | 0 | 5 | 10 | 15 | 30 | 60 |
| Example 7 (%) | 0.0 | 0.2 | 0.4 | 0.7 | 1.4 | 2.6 |
| Example 8 (%) | 0.0 | 5.1 | 9.5 | 12.9 | 19.8 | 29.2 |
| High-specific-area CaO (%) | 0.0 | 8.7 | 12.4 | 15.5 | 21.4 | 29.2 |

Test Example 4

Figure 8:
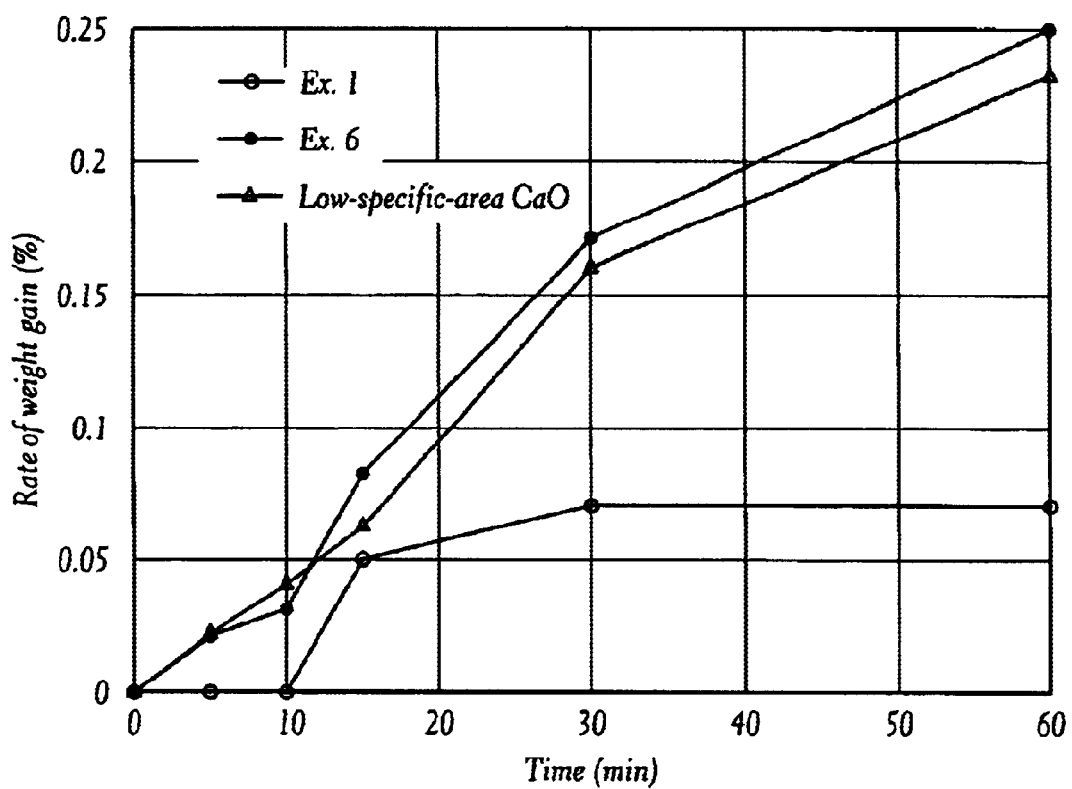
FIG. 8 is a diagrammatic representation of the time course of weight as determined in Test Example 4.

With the sheets obtained in Examples 1 and 6, the same test as described in Test Example 3 was performed. The results are shown in Table 4 and FIG. 8. The test data with the hygroscopic agent (low-specific-area CaO) alone are also shown.

TABLE 4

| | Time (min) | | | | | |
|---|---|---|---|---|---|---|
| | 0 | 5 | 10 | 15 | 30 | 60 |
| Example 1 (%) | 0.00 | 0.00 | 0.00 | 0.05 | 0.07 | 0.07 |
| Example 6 (%) | 0.00 | 0.02 | 0.03 | 0.08 | 0.17 | 0.25 |
| Low-specific-area CaO (%) | 0.00 | 0.02 | 0.04 | 0.06 | 0.16 | 0.23 |

EXAMPLE 9

The hygroscopic agent BaO powder was sufficiently dehydrated by heating at 900° C. for 1 hour, then cooled in a falling rate drying atmosphere of 180–200° C., and ultimately cooled to room temperature. This BaO, 60 weight %, and the resinous component polyethylene (molecular weight: ca 10×10$^4$), 40 weight %, were dry-blended and the blend was melt-kneaded under heating at about 230° C. The kneaded mass was then extruded in sheet form from a T-die to manufacture a moisture absorbing formed body in the form of a 300 μm-thick sheet.

EXAMPLE 10

As the hydroscopic agent, the same BaO as used in Example 9, 60 weight %, and, as the resinous component, a fluororesin (polytetrafluoroethylene (PTFE)), 40 weight %, were thoroughly blended in powdery state. Using a calender roll, the resulting blend was rolled into a 300 μm-thick film. In this sheet, the PTFE resin had been fibrillated to give a BaO-containing porous structure.

Test Example 5

Figure 9:
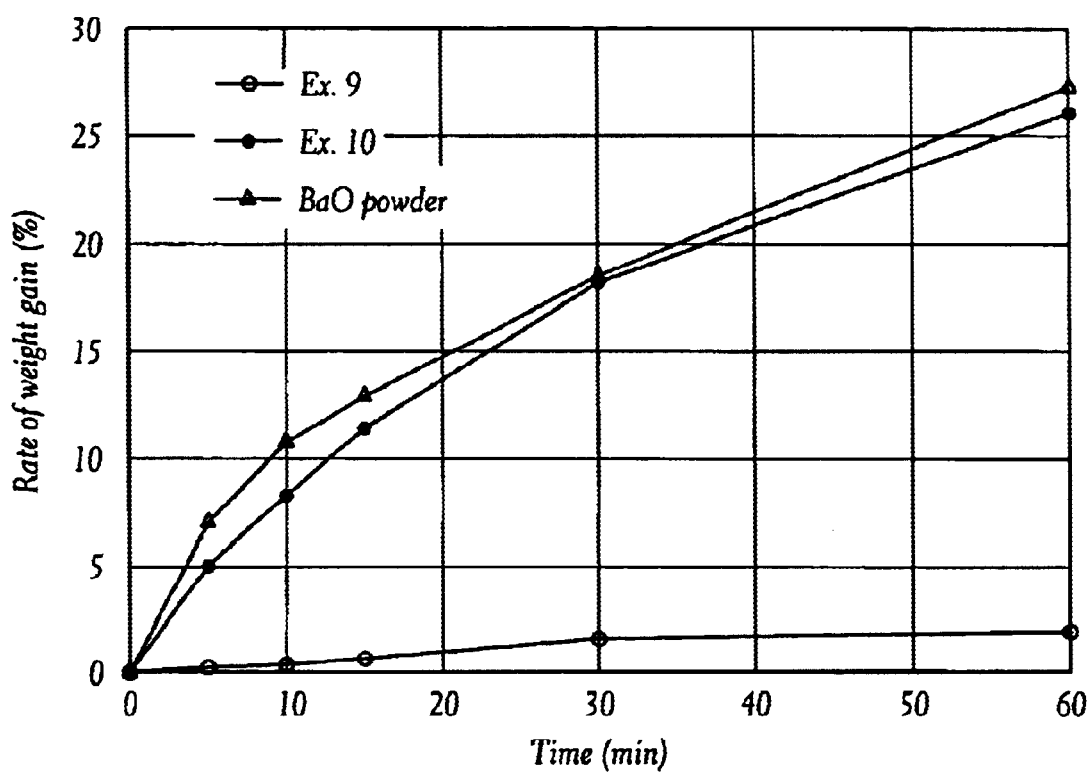
FIG. 9 is a diagrammatic representation of the time course of weight as determined in Test Example 5.

With the sheets obtained in Examples 9 and 10, the same test as described in Test Example 3 was performed. The results are shown in Table 5 and FIG. 9. The test results with the hygroscopic agent alone are also shown.

TABLE 5

| | Time (min) | | | | | |
|---|---|---|---|---|---|---|
| | 0 | 5 | 10 | 15 | 30 | 60 |
| Example 9 (%) | 0.0 | 0.3 | 0.5 | 0.6 | 1.7 | 2.0 |
| Example 10 (%) | 0.0 | 4.9 | 8.2 | 11.4 | 18.2 | 26.1 |
| BaO powder (%) | 0.0 | 6.8 | 10.6 | 12.8 | 18.5 | 27.3 |

Test Example 6

With the sheets obtained in Examples 4, 6, 8 and 10, the same test as described in Test Example 3 was performed.

Figure 10:
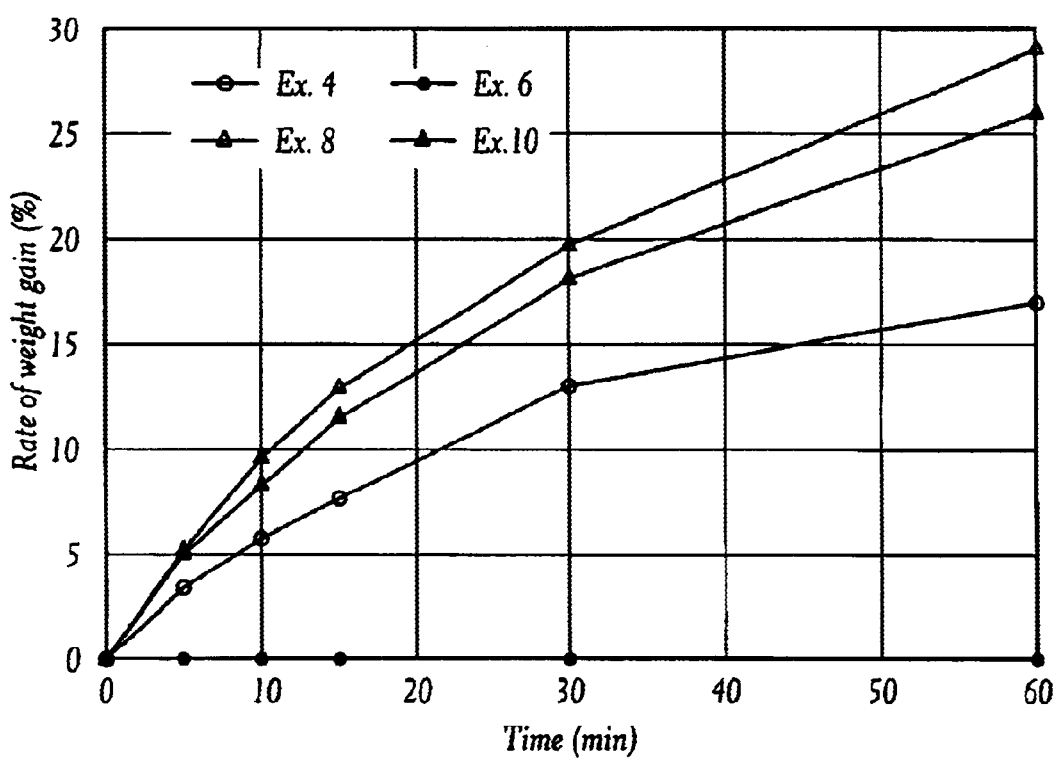
FIG. 10 is a diagrammatic representation of the time course of weight as determined in Test Example 6.

The results are shown in Table 6 and FIG. 10.

TABLE 6

| | Time (min) | | | | | |
|---|---|---|---|---|---|---|
| | 0 | 5 | 10 | 15 | 30 | 60 |
| Example 4 (%) | 0.0 | 3.3 | 5.7 | 7.6 | 13.1 | 17.1 |
| Example 6 (%) | 0.00 | 0.02 | 0.03 | 0.08 | 0.17 | 0.25 |
| Example 8 (%) | 0.0 | 5.1 | 9.5 | 12.9 | 19.8 | 29.2 |
| Example 10 (%) | 0.0 | 4.9 | 8.2 | 11.4 | 18.2 | 26.1 |

The above results indicate that the moisture absorbing formed bodies according to the present invention are invariably capable of showing excellent moisture-absorbing properties. In particular, the formed body of Example 8 as molded using a CaO powder having a high BET specific surface area of 48 m$^2$/g showed the highest moisture absorbing capacity. This formed body is considered to be superior to any other formed body if only from the point of view that CaO is a highly safe substance.

What is claimed is:

1. A moisture absorbing formed body comprising a hygroscopic agent and a resinous component,
    wherein said hygroscopic agent is at least one selected from the group consisting of CaO, BaO and SrO, and
    wherein said resinous component is at least one selected from the group consisting of fluorine-containing resin and polyolefin resin.

2. A moisture absorbing formed body according to claim 1 wherein the hygroscopic agent is a powder having a specific surface area of not less than 10 m$^2$/g.

3. A moisture absorbing formed body according to claim 1 wherein the hygroscopic agent is a powder having a specific surface area of not less than 40 m$^2$/g.

4. A moisture absorbing formed body according to claim 1 wherein the hygroscopic agent accounts for 30–95 weight % of the moisture absorbing formed body.

5. A moisture absorbing formed body according to claim 1 further comprising a gas absorbent.

6. A moisture absorbing formed body according to claim 5 wherein the gas absorbent comprises an inorganic porous substance.

7. A moisture absorbing formed body according to claim 1, the surface of which is covered wholly or in part with a resinous covering layer.

8. A moisture absorbing formed body according to claim 1 for electronic device use.

9. A moisture absorbing formed body according to claim 1 wherein said fluorine-containing resin is selected from the group consisting of polytetrafluoroethylene, polychlorotrifluoroethylene, polyvinylidene fluoride, and ethylene-tetrafluoroethylene copolymer.

10. A moisture absorbing formed body comprising a hygroscopic agent and a resinous component, wherein the resinous component has been fibrillated.

11. A moisture absorbing formed body comprising a hygroscopic agent and a resinous component, wherein the hygroscopic agent is a powder composed of at least one member selected from the group consisting of CaO, BaO and SrO which has a specific surface area of not less than 10 m$^2$/g and the resinous component is a fluorine-containing resin.

12. A moisture absorbing formed body according to claim 11 wherein the fluorine-containing resin has been fibrillated.

* * * * *

(12) EX PARTE REEXAMINATION CERTIFICATE (7026th)
United States Patent
Kawaguchi et al.

(10) Number: US 6,673,436 C1
(45) Certificate Issued: Aug. 25, 2009

(54) MOISTURE ABSORBING FORMED ARTICLE

(75) Inventors: Yohei Kawaguchi, Osaka (JP); Masayuki Fujimori, Shiga (JP); Teruo Uchibori, Shiga (JP); Kaneto Ohyama, Shiga (JP); Atsushi Nishino, Neyagawa (JP)

(73) Assignee: Dynic Corporation, Ukyo-Ku, Kyoto-shi, Kyoto (JP)

Reexamination Request:
No. 90/009,235, Jul. 31, 2008

Reexamination Certificate for:
Patent No.: 6,673,436
Issued: Jan. 6, 2004
Appl. No.: 10/031,622
Filed: Apr. 19, 2002

(22) PCT Filed: May 17, 2001

(86) PCT No.: PCT/JP01/04121
§ 371 (c)(1),
(2), (4) Date: Apr. 19, 2002

(87) PCT Pub. No.: WO01/88041
PCT Pub. Date: Nov. 22, 2001

(30) Foreign Application Priority Data

May 17, 2000 (JP) .......... 2000-145633
Oct. 20, 2000 (JP) .......... 2000-321241

(51) Int. Cl.
C08K 3/22 (2006.01)
C08K 3/00 (2006.01)
C08K 3/03 (2006.01)
H01L 23/016 (2006.01)
H01L 23/026 (2006.01)

(52) U.S. Cl. .............. 428/330; 257/E23.137; 428/331; 428/421; 428/422; 428/523; 524/423; 524/433

(58) Field of Classification Search .......... None
See application file for complete search history.

(56) References Cited

U.S. PATENT DOCUMENTS

| 4,029,830 | A | 6/1977 | Yamamoto et al. |
| 4,081,397 | A | 3/1978 | Booe |
| 5,078,909 | A | 1/1992 | Shigeta et al. |
| 5,591,379 | A | 1/1997 | Shores |
| 5,888,925 | A | 3/1999 | Smith et al. |
| 5,990,373 | A | 11/1999 | Klabunde |

FOREIGN PATENT DOCUMENTS

| JP | 8-217913 | 8/1996 |
| JP | 11-329719 | 11/1999 |
| WO | WO 97/27042 | 7/1997 |

*Primary Examiner*—Jerry D. Johnson

(57) ABSTRACT

An object of the present invention is to provide a material which can absorb moisture with ease and certainly, which exists in an equipment such as an electronic device. The invention relates to a moisture absorbing formed body comprising a hygroscopic agent and a resinous component.

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1–12 are cancelled.

* * * * *